(12) United States Patent
Hayashi et al.

(10) Patent No.: US 11,728,441 B2
(45) Date of Patent: Aug. 15, 2023

(54) SEMICONDUCTOR APPARATUS AND MANUFACTURING METHOD THEREOF, AND DEVICE

(71) Applicant: CANON KABUSHIKI KAISHA, Tokyo (JP)

(72) Inventors: Hideki Hayashi, Kanagawa (JP); Junji Iwata, Tokyo (JP); Keita Torii, Kanagawa (JP); Yusuke Todo, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 200 days.

(21) Appl. No.: 17/214,637

(22) Filed: Mar. 26, 2021

(65) Prior Publication Data
US 2021/0305439 A1    Sep. 30, 2021

(30) Foreign Application Priority Data
Mar. 30, 2020    (JP) ................. 2020-060351

(51) Int. Cl.
*H01L 31/02*    (2006.01)
*H01L 31/18*    (2006.01)
*H01L 31/107*    (2006.01)

(52) U.S. Cl.
CPC ...... *H01L 31/02005* (2013.01); *H01L 31/107* (2013.01); *H01L 31/1804* (2013.01)

(58) Field of Classification Search
CPC ............. H01L 31/02005; H01L 31/107; H01L 31/1804; H01L 31/02027; H01L 27/14603; H01L 27/14609; Y02E 10/547
See application file for complete search history.

(56) References Cited

U.S. PATENT DOCUMENTS

| 9,887,229 B2 * | 2/2018 | Ho ........................ H01L 23/481 |
| 2008/0246152 A1 * | 10/2008 | Liu ........................ H01L 24/48 |
| | | 257/758 |
| 2013/0222657 A1 | 8/2013 | Shimotsusa |

(Continued)

FOREIGN PATENT DOCUMENTS

| DE | 102019124181 A1 * | 4/2020 | ........... H01L 21/187 |
| JP | 2014072295 A | 4/2014 | |
| WO | WO-2019010320 A1 * | 1/2019 | ............... B81B 5/00 |

*Primary Examiner* — Sitaramarao S Yechuri
(74) *Attorney, Agent, or Firm* — Canon U.S.A., Inc. I.P. Division

(57) ABSTRACT

A semiconductor apparatus includes a first semiconductor layer, a second semiconductor layer, and a structure provided between the first and second semiconductor layers. The semiconductor apparatus further includes a first electrode supported by a first insulating layer, a second electrode supported by a second insulating layer, a first wire bonded to the first electrode through a first opening provided in the first semiconductor layer, and a second wire bonded to the second electrode through a second opening provided in the first semiconductor layer, and an annular member made of a non-insulating material and provided between the first semiconductor layer and the first electrode. A distance from the second semiconductor layer to a first joint between the first electrode and the first wire is longer than a distance from the second semiconductor layer to a second joint between the second electrode and the second wire.

27 Claims, 14 Drawing Sheets

(56) References Cited

U.S. PATENT DOCUMENTS

| | | | |
|---|---|---|---|
| 2013/0299886 A1* | 11/2013 | Chuang | H01L 31/1868 |
| | | | 257/292 |
| 2014/0091414 A1 | 4/2014 | Shimotsusa | |
| 2014/0124889 A1* | 5/2014 | Qian | H01L 27/14618 |
| | | | 438/455 |
| 2016/0233264 A1* | 8/2016 | Kagawa | H01L 21/76898 |
| 2017/0221950 A1* | 8/2017 | Ho | H01L 27/14623 |
| 2018/0374795 A1* | 12/2018 | Deguchi | H01L 23/522 |
| 2020/0105814 A1* | 4/2020 | Hashiguchi | H01L 25/18 |

\* cited by examiner

SEMICONDUCTOR APPARATUS AND MANUFACTURING METHOD THEREOF, AND DEVICE

BACKGROUND

Field

The present disclosure relates to a semiconductor apparatus and a manufacturing method thereof.

Description of the Related Art

Photoelectric conversion apparatuses such as a CMOS image sensor, which is a type of a semiconductor apparatus, may adopt a structure in which a photoelectric conversion unit and a signal processing unit are formed individually on separate semiconductor substrates (chips), and the semiconductor substrates are superimposed on each other, whereby the semiconductor substrates are electrically connected to each other by a conductive member.

Accordingly, an occupancy area (a footprint) of the photoelectric conversion apparatus in a device, to which the photoelectric conversion apparatus is mounted, can be reduced.

Japanese Patent Application Laid-open No. 2014-72295 discloses a semiconductor apparatus including a first semiconductor layer 33 and a second semiconductor layer 55. A plurality of insulating layers and an opening 77 that penetrates the first semiconductor layer 33 are provided on an electrode pad 78, and a bonding wire 79 connected to the electrode pad 78 is provided in the opening 77. According to the technique disclosed in Japanese Patent Application Laid-open No. 2014-72295, since the electrode pad is arranged close to the second semiconductor layer and the electrode pad is at a distance from the first semiconductor layer, there is a problem in an electric path through the electrode pad.

SUMMARY

In the current disclosure, a technique for improving an electric path in a semiconductor apparatus is provided to resolve the problem discussed above.

According to the disclosure, it is provided a semiconductor apparatus including a first semiconductor layer; a second semiconductor layer stacked to the first semiconductor layer; a structure provided between the first semiconductor layer and the second semiconductor layer, a first electrode supported by a first insulating layer and included in the structure; a second electrode supported by a second insulating layer and included in the structure; a first wire bonded to the first electrode through a first opening provided in at least the first semiconductor layer; a second wire bonded to the second electrode through a second opening provided in at least the first semiconductor layer; and an annular member made of a non-insulating material and provided between the first semiconductor layer and the first electrode, the annular member enclosing the first wire and constitutes a side surface of the first opening, wherein a distance from the second semiconductor layer to a first joint between the first electrode and the first wire is longer than a distance from the second semiconductor layer to a second joint between the second electrode and the second wire.

According to the disclosure, it is provided a manufacturing method for a semiconductor apparatus, the method including the steps of forming a stacked body with a structure, the structure including a first electrode and a second electrode are formed at different depths, and is interposed between a first semiconductor layer and a second semiconductor layer; and forming, by etching, a first opening reaching the first electrode from a surface of the first semiconductor layer and exposing the first electrode as a pad for wire bonding, and a second opening reaching the second electrode from the surface of the first semiconductor layer and exposing the second electrode as a pad for wire bonding.

According to the disclosure, it is provided a device including the semiconductor apparatus as described above and a peripheral apparatus connected to the semiconductor apparatus.

Further features of the present disclosure will become apparent from the following description of exemplary embodiments with reference to the attached drawings.

DESCRIPTION OF THE EMBODIMENTS

Figure 1:
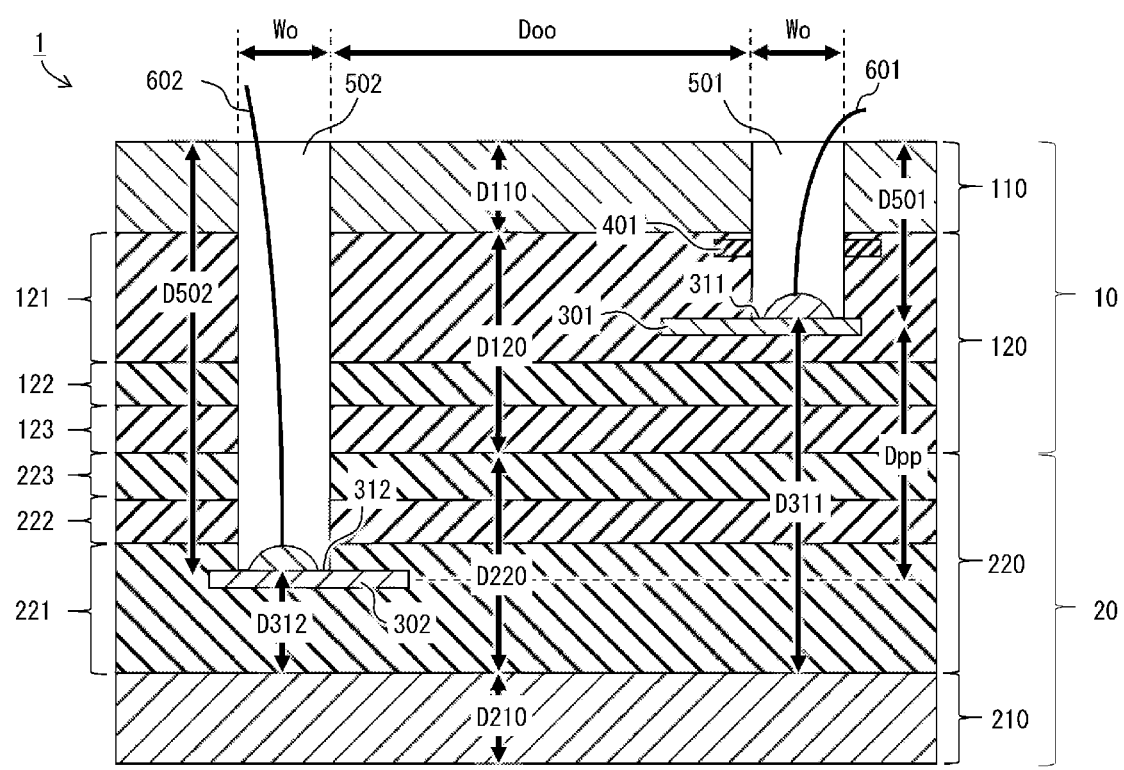
FIG. 1 is a sectional view of features of a semiconductor apparatus according to a first embodiment.

The present embodiments relate to a semiconductor apparatus with a structure provided with a first semiconductor layer and a second semiconductor layer having a wiring structure interposed therebetween and to a manufacturing method for the semiconductor apparatus. For example, the present embodiments relate to a structure for supplying power and inputting and outputting signals with respect to each of the first semiconductor layer and the second semiconductor layer using wire bonding and to a manufacturing method for the structure. In the embodiments presented below, an example will be described of applying the present disclosure to a semiconductor apparatus structured such that a first component (a first semiconductor substrate) in which the first semiconductor layer is formed and a second component (a second semiconductor substrate) in which the second semiconductor layer is formed are bonded to each other. The configuration of the present embodiments is particularly suitable for apparatuses in which a voltage difference in supplied power between the first component and the second component is large (>approximately 20 V).

While known methods of supplying power to a semiconductor substrate include a method using wire bonding and a method using a through silicon via (TSV), the present embodiments adopt a power supply structure using wire bonding which is capable of reducing manufacturing cost. Since an electrode (pad) for wire bonding is considerably larger than that for a TSV, in the case of wire bonding, an area of an opening to be formed in a wiring structure increases. Therefore, it is difficult to repurpose structures and manufacturing methods for TSV without modification.

For example, in a semiconductor apparatus structured such that the first component and the second component are bonded to each other, when forming an opening for wire bonding on a surface of either component, a depth of an opening intended for a pad of the first component differs from a depth of an opening intended for a pad of the second component. When forming openings of different depths on a substrate by dry etching, generally, a shallow opening and a deep opening are separately machined using separate masks. However, this method cannot be used in the case of an opening for wire bonding. This is due to the fact that, since an opening for wire bonding has a wide area, striation occurs in the shallow opening when, for example, applying a resist for etching the deep opening after forming the shallow opening. In other words, when film thickness is controlled by rotating a wager after applying the resist, radial wrinkles are created in a coating from the shallow opening as a point of origin. This is a trouble that affects photolithography.

For this reason, simultaneous etching of openings must be performed in order to form at least two openings for wire bonding with different depths.

In simultaneous etching of openings involving at least two openings with different depths, damage to wiring and metal contamination due to excessive etching on an electrode become an issue particularly after the electrode is exposed at a shallow opening. In consideration thereof, in the present embodiments, progress of etching of a portion of a shallow opening is delayed in comparison to a portion of a deep opening by providing an etching stopper film between an etching start surface and a metal electrode in a region where the shallow opening is to be formed. Accordingly, a difference in thickness between layers to be etched can be alleviated and excessive etching to an electrode can be reduced.

A material that differs from a wiring structure is used as a material of the etching stopper film. Specifically, any material with resistance to etching gas used in the etching of the wiring structure may be used. In the present embodiments, polycrystalline silicon is used as the material of the etching stopper film for the following reasons.

As a premise, in forming an opening for wire bonding, a multilayer film of interlayer insulating layers such as SiO, SiN, and SiC which constitute a multilayer wiring structure of a silicon device must be etched. When performing such multilayer film etching, dry etching conditions of a fluorocarbon-based gas (hereinafter, referred to as a "CF-based gas") is preferably used. Under dry etching conditions using a CF-based gas, a polycrystalline silicon film has a slower etching rate than insulating layers that are etching objects and acts as an etching stopper film.

In addition, in dry etching using a CF-based gas, deposited material that is created during etching of an etching stopper film made of polycrystalline silicon is SiF. Since SiF is highly volatile and readily discharged, SiF hardly adheres to side walls or the like of an etching opening. In this regard, using polycrystalline silicon as an etching stopper film is more effective than using a metal-based material.

Furthermore, a portion that remains without being etched among the etching stopper film is retained inside the wiring structure as a member in which a through-hole is formed due to the opening and which is exposed in a ring shape on an inner wall of the opening. Specifically, an annular member which encloses a wire, which constitutes a part of the side surface (inner wall) of the opening, and which is made of a non-insulating material is formed between the etching start surface and an electrode. Due to a gettering effect of polycrystalline silicon, the annular member produces a secondary effect of reducing metal contamination at the opening. This effect contributes toward, for example, improving characteristics of the photoelectric conversion apparatus.

First Embodiment

Hereinafter, a specific example of a structure and a manufacturing method for a semiconductor apparatus according to the present embodiment will be described. In the following description and in the drawings, components common to a plurality of drawings are denoted by common reference characters. Therefore, descriptions of components denoted by common reference characters will be omitted as deemed appropriate.

Structure of Semiconductor Apparatus

FIG. 1 is a sectional view of features of a semiconductor apparatus 1 and schematically shows a structure of at least two openings for wire bonding with different depths. In FIG. 1, reference numeral 10 denotes a first chip, 110 denotes a first semiconductor layer, 120 denotes a first wiring structure unit, 121, 122, and 123 denote insulating layers, 20 denotes a second chip, 210 denotes a second semiconductor layer, 220 denotes a second wiring structure unit, and 221, 222, and 223 denote insulating layers. Reference numeral 301 denotes a first electrode, 302 denotes a second electrode, 401 denotes a polycrystalline silicon etching stopper film, 501 denotes a first opening, and 502 denotes a second opening.

The first chip 10 is a silicon semiconductor substrate. The first chip (the first component) 10 has the first semiconductor layer 110 and the first wiring structure unit 120. Although not illustrated in FIG. 1, a plurality of semiconductor devices are formed in the first semiconductor layer 110. The first wiring structure unit 120 is made up of a plurality of insulating layers and, in FIG. 1, the insulating layers 121, 122, and 123 are formed as interlayer insulating layers or inter-wiring insulating layers. Although not illustrated in FIG. 1, a wiring pattern made of a conductor is formed in the first wiring structure unit 120. In addition, the first electrode 301 to be a pad for wire bonding and the polycrystalline silicon etching stopper film 401 are formed inside the first wiring structure unit 120. The first electrode 301 is supported by the insulating layer (the first insulating layer) 121. The first electrode 301 is an electrode to which is applied voltage to be supplied to the semiconductor devices formed in the first semiconductor layer 110.

The second chip 20 is a silicon semiconductor substrate. The second chip (the second component) 20 has the second semiconductor layer 210 and the second wiring structure unit 220. Although not illustrated in FIG. 1, a semiconductor device is formed in the second semiconductor layer 210. The second wiring structure unit 220 is made up of a plurality of insulating layers and, in FIG. 1, the insulating layers 221, 222, and 223 are formed as interlayer insulating layers or inter-wiring insulating layers. Although not illustrated in FIG. 1, a wiring pattern made of a conductor is formed in the second wiring structure unit 220. In addition, the second electrode 302 to be a pad for wire bonding is formed inside the second wiring structure unit 220. The second electrode 302 is supported by the insulating layer (the second insulating layer) 221. The second electrode 302 is an electrode to which is applied voltage to be supplied to the semiconductor device formed in the second semiconductor layer 210.

The semiconductor apparatus 1 according to the present embodiment has a structure in which two semiconductor substrates, namely, the first chip 10 that is the first component and the second chip 20 that is the second component are superimposed on each other so that the first wiring structure unit 120 and the second wiring structure unit 220 face each other. A surface of the first wiring structure unit 120 and a surface of the second wiring structure unit 220 are bonded to each other and, at the same time, a wiring pattern of the first wiring structure unit 120 and a wiring pattern of the second wiring structure unit 220 are electrically connected to each other. The wiring structure is formed by the first wiring structure unit 120 and the second wiring structure unit 220.

The first semiconductor layer 110 is provided with the first opening 501 to be used to expose the first electrode 301 and the second opening 502 to be used to expose the second electrode 302. An exposed portion of the first electrode 301 becomes a first pad (a first joint) 311 for wire bonding and an exposed portion of the second electrode 302 becomes a second pad (a second joint) 312 for wire bonding. A first wire 601 that applies voltage to the first electrode 301 is bonded to the first pad 311 through the first opening 501. A second wire 602 that applies voltage to the second electrode 302 is bonded to the second pad 312 through the second opening 502.

The semiconductor device that is formed in the first semiconductor layer 110 and the second semiconductor layer 210 is, for example, a transistor, a diode, a photodiode, an avalanche photodiode, a single photon avalanche diode, an inverter, or a thyristor. In the case of a photoelectric conversion apparatus, for example, a photoelectric conversion unit is formed by a photodiode, a transistor, or the like in the first semiconductor layer 110 and a signal processing circuit is formed in the second semiconductor layer 210. The semiconductor apparatus 1 according to the present embodiment may be a photoelectric conversion apparatus called a single photon avalanche diode (hereinafter abbreviated as SPAD) which uses an avalanche photodiode as a photoelectric conversion unit. In an SPAD, since a high voltage of around 30 V is applied to the photoelectric conversion unit and a voltage of around 5 V is applied to the signal processing unit, there is a major difference in the voltages applied to the respective semiconductor substrates. Therefore, an electrode for applying voltage to be supplied to the photoelectric conversion unit and an electrode for applying voltage to be supplied to the signal processing unit must be divided. Since these electrodes are formed in the respective semiconductor substrates from the perspective of improving reliability, a structure for approaching the electrodes that exist at different depths from the surface of the photoelectric conversion apparatus is required. Such a structure can be applied to various semiconductor apparatuses that realizes a so-called system-in-package.

Figure 2:
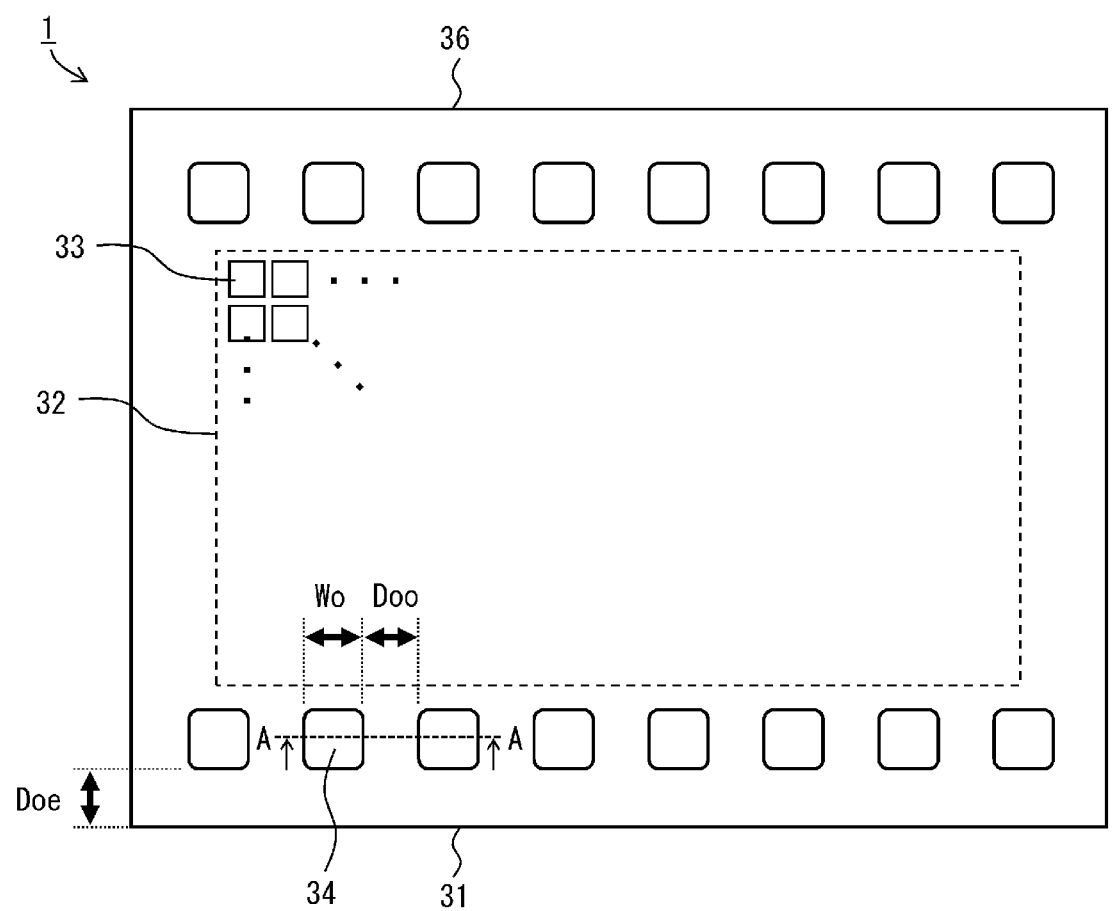
FIG. 2 is a plan view of the features of the semiconductor apparatus according to the first embodiment.

FIG. 2 is a plan view of the semiconductor apparatus 1. FIG. 2 shows a photoelectric conversion apparatus (for example, a solid-state imaging apparatus such as a CMOS image sensor) as an example of the semiconductor apparatus 1. The semiconductor apparatus 1 has, at a center thereof, a pixel region 32 in which a plurality of pixels 33 are arranged in a two-dimensional array pattern. Each pixel 33 is formed by a plurality of semiconductor devices such as a photodiode or a transistor.

A plurality of openings 34 are provided on the surface of the semiconductor apparatus 1. The opening 34 corresponds to the first opening 501 or the second opening 502 in FIG. 1 and represents a structure for exposing an electrode formed inside a wiring structure as a pad for wire bonding. A part of the plurality of openings 34 is arranged along a single edge 31 of the semiconductor apparatus 1. In FIG. 2, eight openings 34 are arranged along the edge 31. An edge of the semiconductor apparatus 1 is obtained by dicing a semiconductor wafer for singulating the semiconductor apparatus 1. A distance between each of the openings 34 arranged along the edge 31 and the edge 31 is shorter than a distance between the pixel region 32 and the edge 31. In addition, another part of the plurality of openings 34 is arranged along an edge 36 on an opposite side to the edge 31.

An arrangement of the first openings (shallow openings) 501 and the second openings (deep openings) 502 may be freely designed. For example, the first openings 501 may be arranged along the edge 31 and the second openings 502 may be arranged along the opposite-side edge 36. Alternatively, both the first openings 501 and the second openings 502 may be respectively arranged along the edge 31 and the edge 36. In this case, the first openings 501 and the second openings 502 may be alternately arranged or respectively collectively arranged. In addition, while openings are arranged along two vertical edges in the example shown in FIG. 2, the openings may be arranged along two horizontal edges or arranged along a single edge or along at least three edges. Furthermore, at least two rows of openings may be arranged along an edge.

An example of sizes of respective structures of the semiconductor apparatus 1 will be described with reference to FIGS. 1 and 2. It should be noted that none of the drawings attached to the present specification accurately represent actual sizes and there may be cases where relative sizes among the respective structures are depicted so as to differ from reality for the sake of convenience of illustration.

In FIG. 2, Wo denotes a width of the opening 34 in a direction parallel to an edge of the semiconductor apparatus 1. In the present specification, while "two directions being parallel" means that an angle formed by the two directions is 0 degrees, "two directions being parallel" may be a concept that includes error from the perspective of an embodiment and, for example, the angle formed by the two directions may be not more than 5 degrees. When the opening 34 has a rectangular contour, Wo may be a length of a side in a direction parallel to the edge 31. When the opening 34 has a square contour, Wo may be a length of one of the sides of the square. When the opening 34 has a circular contour, Wo may be a diameter of the circle.

Doo denotes a distance between two adjacent openings 34. Doo may represent a distance in a direction parallel to the edge 31 or a shortest distance between the two adjacent openings 34.

Doe denotes a distance between the opening 34 and the edge 31. Doe may represent a distance in a direction perpendicular to the edge 31. In the present specification, while "two directions being perpendicular" means that an angle formed by the two directions is 90 degrees, "two directions being perpendicular" may be a concept that includes error from the perspective of an embodiment and, for example, the angle formed by the two directions may be at least 85 degrees and not more than 95 degrees. Doe may represent a shortest distance between the opening 34 and the edge 31.

The width Wo of the opening 34 may satisfy 50 µm≤Wo≤200 µm or may satisfy 50 µm≤Wo≤150 µm and may be, for example, 80 µm. The distance Doo between two adjacent openings 34 may satisfy 50 µm≤Doo≤250 µm or may satisfy 120 µm≤Doo≤160 µm and may be, for example, 140 µm. Wo<Doo may be satisfied. The distance Doe between the opening 34 and the edge 31 may satisfy 50 µm≤Doe≤200 µm or may satisfy 70 µm≤Doe≤150 µm and may satisfy Doe≤Doo.

FIG. 1 corresponds to an A-A cross section in FIG. 2. In FIG. 1, reference character D110 denotes a thickness of the first semiconductor layer 110, D120 denotes a thickness of the first wiring structure unit 120, D210 denotes a thickness of the second semiconductor layer 210, and D220 denotes a thickness of the second wiring structure unit 220. Reference character D501 denotes an opening depth of the first opening 501 or a distance from the surface of the first semiconductor layer 110 to the first electrode 301, and D502 denotes an opening depth of the second opening 502 or a distance from the surface of the first semiconductor layer 110 to the second electrode 302. Reference character Dpp denotes a difference in depths between the first electrode 301 and the second electrode 302 or, in other words, a difference between the depths of the first opening 501 and the second opening 502 (Dpp=D502−D501). Reference character D311 denotes a distance from the second semiconductor layer 210 to the first pad (first joint) 311, and D312 denotes a distance from the second semiconductor layer 210 to the second pad (second joint) 312.

The thickness D110 of the first semiconductor layer 110 may satisfy 1 µm≤D110≤100 µm, may satisfy 1 µm≤D110≤50 µm, may satisfy 1 µm≤D110≤10 µm, or may satisfy 2 µm≤D110≤5 µm. In the present embodiment, for example, D110=3 µm is adopted. The thickness D120 of the first wiring structure unit 120 may satisfy 0.5 µm≤D120≤50 µm or may satisfy 1 µm≤D120≤10 µm. In the present embodiment, for example, D120=5 µm is adopted.

The thickness D210 of the second semiconductor layer 210 may satisfy 50 µm≤D210≤800 µm. The thickness D210 of the second semiconductor layer 210 and the thickness D110 of the first semiconductor layer 110 may satisfy D210>D110. The thickness D220 of the second wiring structure unit 220 may satisfy 0.5 µm≤D220≤50 µm or may satisfy 1 µm≤D220≤10 µm. In the present embodiment, for example, D220=5 µm is adopted. However, the thickness D120 of the first wiring structure unit 120 and the thickness D220 of the second wiring structure unit 220 need not be the same.

The opening depth D501 of the first opening 501 may satisfy 1 µm≤D501≤100 µm, may satisfy 1 µm≤D501≤20 µm, may satisfy 1 µm≤D501≤10 µm, or may satisfy 1 µm≤D501≤5 µm. In addition, the opening depth D502 of the second opening 502 may satisfy 1 µm≤D502≤100 µm, may satisfy 1 µm≤D502≤20 µm, may satisfy 1 µm≤D502≤10 µm, or may satisfy 5 µm≤D502≤10 µm. However, D501<D502 is satisfied. The difference in opening depths Dpp may satisfy 1 µm≤Dpp≤100 µm, may satisfy 1 µm≤Dpp≤20 µm, may satisfy 1 µm≤Dpp≤10 µm, or may satisfy 1 µm≤Dpp≤5 µm. The distance D311 from the second semiconductor layer 210 to the first pad 311 is longer than the distance D312 from the second semiconductor layer 210 to the second pad 312 (D311>D312).

While both the first opening 501 and the second opening 502 are depicted in FIG. 1 so that the opening depths appear to be larger than the opening width, this is done so simply for the sake of convenience of illustration. In an actual configuration, both the first opening 501 and the second opening 502 are shaped so that the opening width Wo is larger than the opening depths D501 and D502 (D501<Wo, D502<Wo). This is because a certain opening width is required in order to perform bonding of a wire on an electrode (pad) that is exposed at a bottom of an opening. In the present embodiment, for example, settings of Wo=80 µm, D501=4 µm, and D502=10 µm are adopted.

Manufacturing Method

Next, a manufacturing method for the semiconductor apparatus 1 and, in particular, a formation method for an opening for wire bonding will be described. In the present embodiment, opening etching is performed using a common photoresist from a side of the surface of the first semiconductor layer 110 with respect to a stacked body in which the first chip 10 and the second chip 20 are bonded to each other to simultaneously form the shallow first opening 501 and the deep second opening 502.

Figure 3:
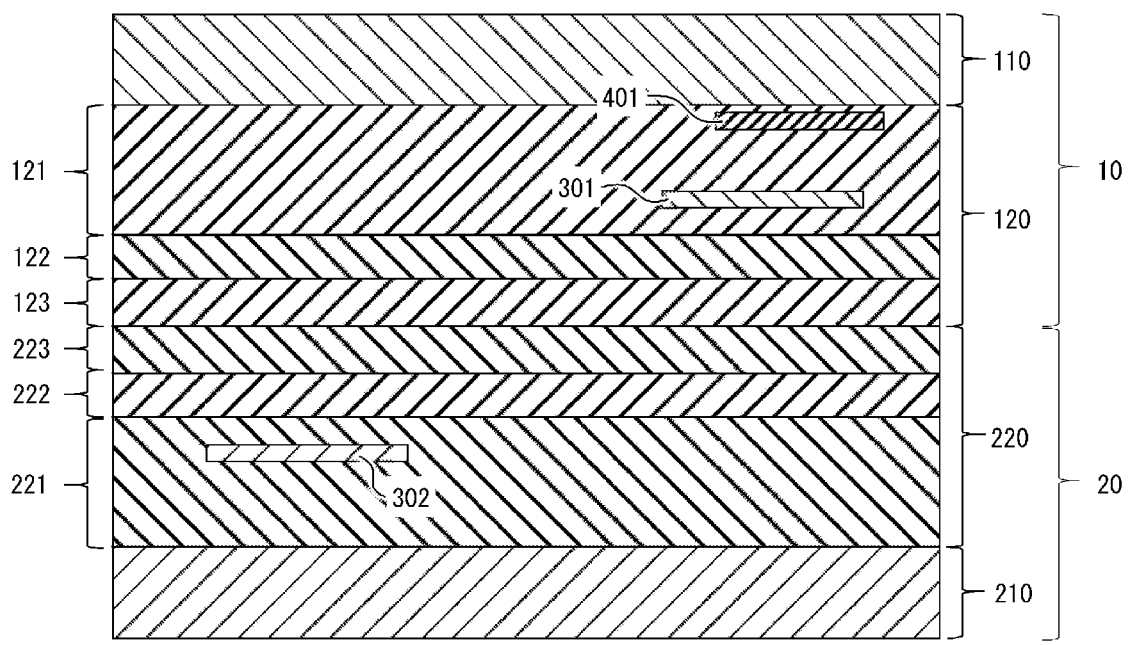
FIG. 3 is an explanatory diagram of step A of a manufacturing method for the semiconductor apparatus according to the first embodiment.
Figure 6:
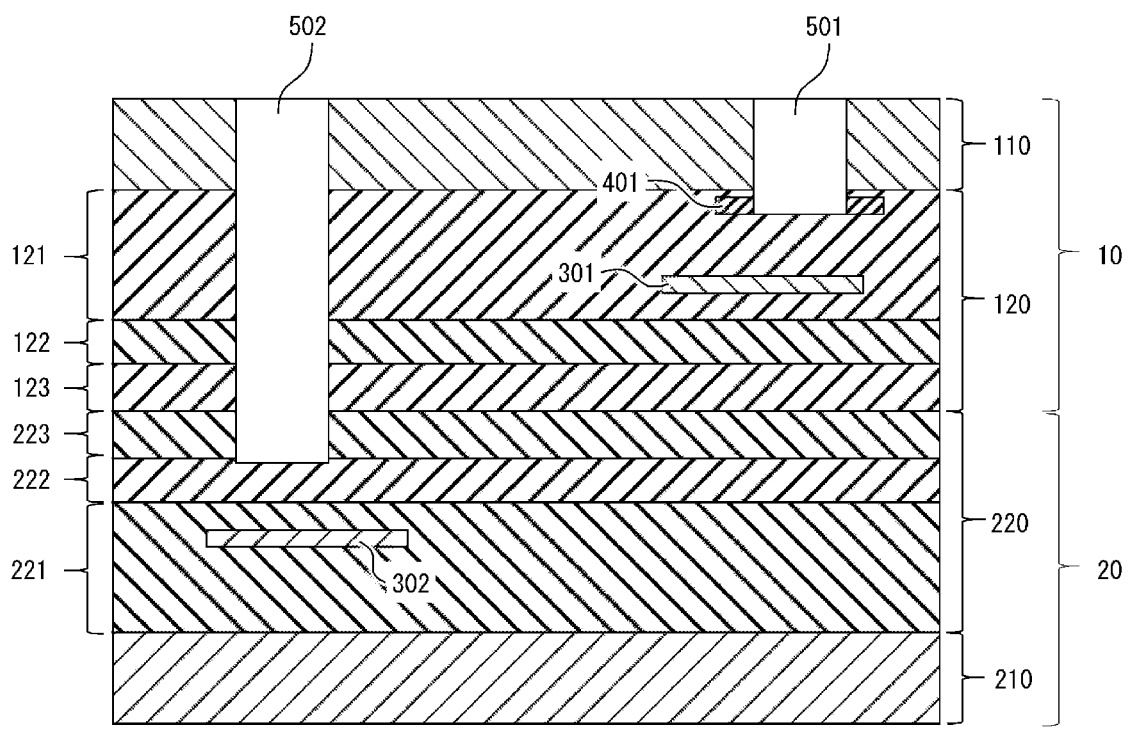
FIG. 6 is an explanatory diagram of step B3 of the manufacturing method for the semiconductor apparatus according to the first embodiment.
Figure 7:
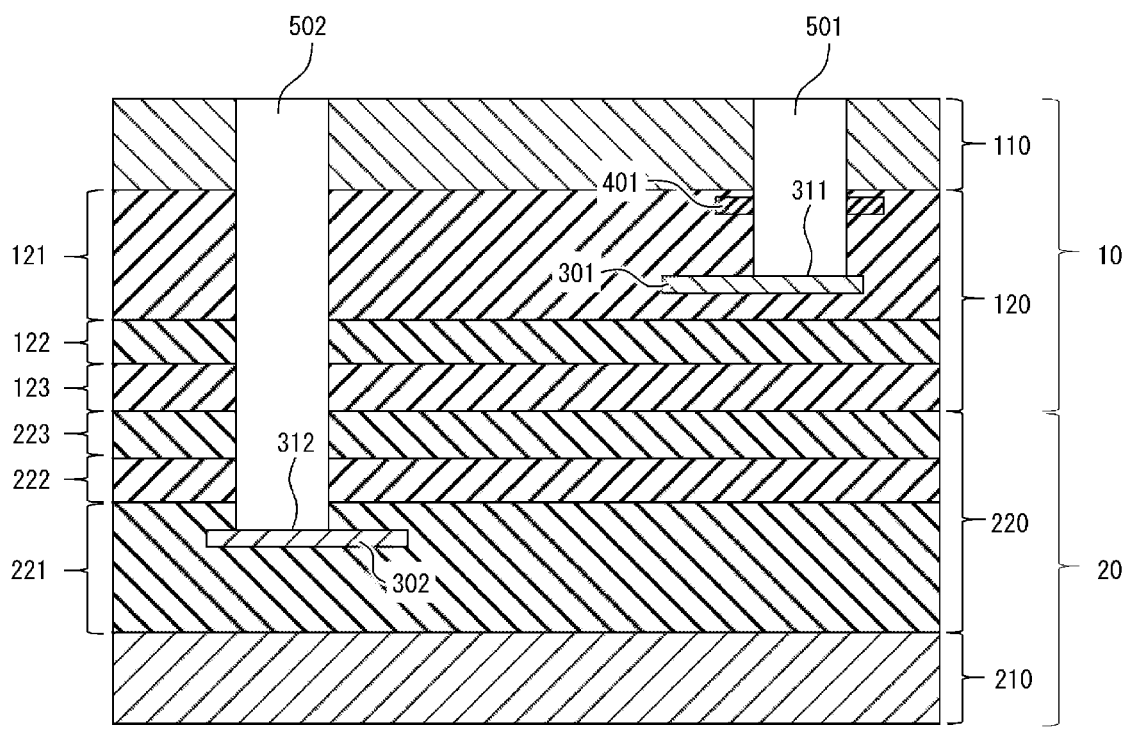
FIG. 7 is an explanatory diagram of step B4 of the manufacturing method for the semiconductor apparatus according to the first embodiment.
Figure 8:
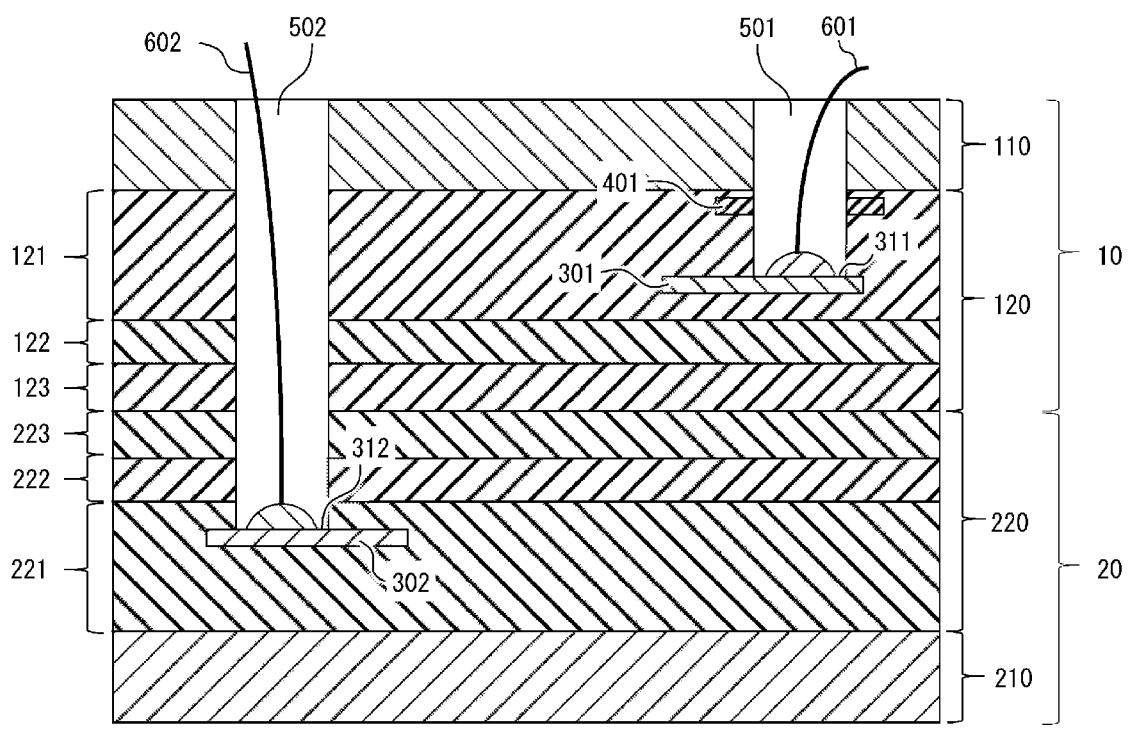
FIG. 8 is an explanatory diagram of step C of the manufacturing method for the semiconductor apparatus according to the first embodiment.

FIGS. 3 to 8 show parts of steps of the manufacturing method for the semiconductor apparatus 1. FIG. 3 shows a forming step A of the stacked body, FIGS. 4 to 7 show an etching step B of the at least two openings for wire bonding, and FIG. 8 shows a wire bonding step C.

(Step A)

FIG. 3 shows a state after performing step A. In step A, first, by forming the first wiring structure unit 120 on the first semiconductor layer 110, the first chip (first semiconductor substrate) 10 is formed. A silicon substrate is used as the first semiconductor layer 110 in the present example. Although not illustrated in FIG. 3, a plurality of semiconductor devices are formed in the first semiconductor layer 110. The first wiring structure unit 120 is provided with the insulating layers 121, 122, and 123 as interlayer insulating layers or inter-wiring insulating layers. As long as there are at least two insulating layers, any number of insulating layers may be stacked. The insulating layers 121 and 123 are insulators made of, for example, silicon oxide, and the insulating layer 122 is an insulator made of, for example, silicon nitride or silicon carbide. Although not illustrated in FIG. 3, a wiring pattern made of a conductor is formed in the first wiring structure unit 120. In addition, the first electrode 301 to be a pad for wire bonding and the polycrystalline silicon etching stopper film 401 (hereinafter, also described as an "etching stopper film 401" or a "polycrystalline silicon film 401") are formed inside the first wiring structure unit 120. The first electrode 301 is an electrode made of, for example, aluminum or an aluminum alloy. The etching stopper film 401 is formed only between the first semiconductor layer 110 and the first electrode 301 and in a region where the first opening 501 is to be formed (a region slightly wider than a portion to be removed by etching of the first opening 501). In other words, the etching stopper film 401 is not formed in a region where the second opening 502 is to be formed. When the first chip 10 includes another member that is made of the same material as the etching stopper film 401, the etching stopper film 401 may be simultaneously formed in a same step as the other member that is made of the same material. For example, when forming a gate electrode of a MOS transistor with polycrystalline silicon, the etching stopper film 401 and the gate electrode may be formed in a same process. In this case, the other member that is made of the same material as the etching stopper film 401 is arranged at a position that avoids the region in which the second opening 502 is to be formed. This is done so not to inhibit etching of the second opening 502.

In a similar manner, by forming the second wiring structure unit 220 on the second semiconductor layer 210, the second chip (second semiconductor substrate) 20 is formed. A silicon substrate is used as the second semiconductor layer 210 in the present example. Although not illustrated in FIG. 3, a plurality of semiconductor devices are formed in the second semiconductor layer 210. The second wiring structure unit 220 is provided with the insulating layers 221, 222, and 223 as interlayer insulating layers or inter-wiring insulating layers. As long as there are at least two insulating layers, any number of insulating layers may be stacked. The insulating layers 221 and 223 are insulators made of, for example, silicon oxide, and the insulating layer 222 is an insulator made of, for example, silicon nitride or silicon carbide. Although not illustrated in FIG. 3, a wiring pattern made of a conductor is formed in the second wiring structure unit 220. In addition, the second electrode 302 to be a pad for wire bonding is formed inside the second wiring structure unit 220. The second electrode 302 is an electrode made of, for example, aluminum or an aluminum alloy.

In step A, further, the first chip 10 and the second chip 20 are bonded to each other so that the first wiring structure unit 120 and the second wiring structure unit 220 face each other. Accordingly, a stacked body is formed having the wiring structure units 120 and 220 in which the first electrode 301 and the second electrode 302 are formed at different depths and the first semiconductor layer 110 and the second semiconductor layer 210 being provided so as to interpose therebetween the wiring structure units 120 and 220.

Next, steps B1 to B4 of simultaneous etching of openings will be described with reference to FIGS. 4 to 7.
(Step B1)

Figure 4:
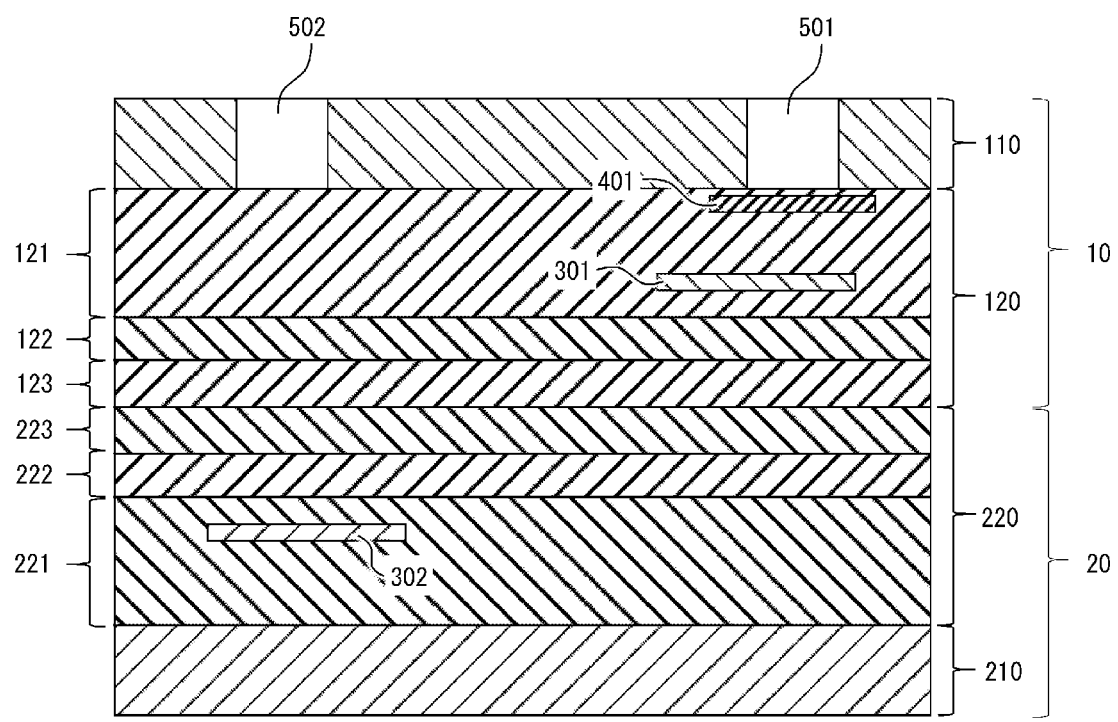
FIG. 4 is an explanatory diagram of step B1 of the manufacturing method for the semiconductor apparatus according to the first embodiment.

FIG. 4 shows a state after performing step B1. In step B1, dry etching of the first opening 501 and the second opening 502 is advanced to open the first semiconductor layer 110 until the first wiring structure unit 120 is reached. This dry etching step will be described in detail below.

In etching of a silicon substrate, a dry etching apparatus to be used must be capable of using a deep etching technique such as a so-called Bosch process and an ICP etching apparatus can be exemplified as a processing apparatus therefor.

The first semiconductor layer 110 is assumed to be Si, and $SF_6$ is conceivable as an etching gas thereof. In this etching step, an additive gas such as $O_2$, $N_2$, He, or Ar may be used when appropriate.

When plasma etching is performed using the apparatus described above and the gas described above, a reaction expressed as follows occurs and etching proceeds as a reaction product is discharged from an etching processing chamber.

First semiconductor layer 110: 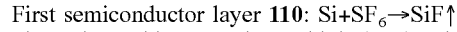

Since the etching step has a high (>10) selection ratio between an insulating film and silicon, etching can be readily stopped once the first wiring structure unit 120 is reached. The etching of step B1 is stopped once the first wiring structure unit 120 is reached.

(Step B2)

Figure 5:
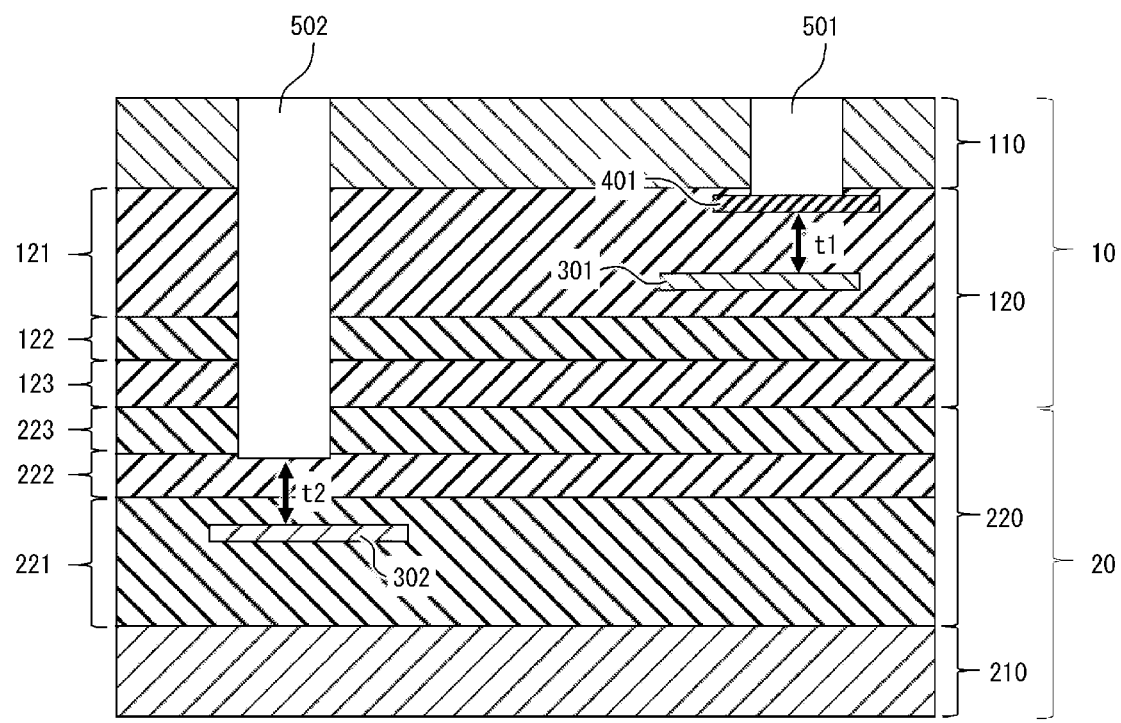
FIG. 5 is an explanatory diagram of step B2 of the manufacturing method for the semiconductor apparatus according to the first embodiment.

FIG. 5 shows a state after performing step B2. In step B2, dry etching of the first opening 501 and the second opening 502 is further advanced. In doing so, the polycrystalline silicon film 401 functions as an etching stopper. This dry etching step will be described in detail below.

Since deep etching of Si is performed in step B1, the dry etching apparatus to be used is desirably an etching apparatus capable of performing a Bosch process in order to collectively perform simultaneous etching of openings. An ICP etching apparatus can be exemplified as such a dry etching apparatus.

The first wiring structure unit 120 and the second wiring structure unit 220 in the drawing are assumed to be insulating films of silicon oxide, silicon nitride, or silicon carbide and metal wiring does not exist in an opening region (a region to be etched). These multilayer films are desirably collectively etched and a fluorocarbon-based gas such as $CF_4$ is conceivable as an etching gas therefor. In this etching step, an additive gas such as $O_2$, $N_2$, He, or Ar may be used when appropriate.

When plasma etching is performed using the apparatus described above and the gas described above, a reaction expressed as follows occurs and etching proceeds as a reaction product is discharged from an etching processing chamber.

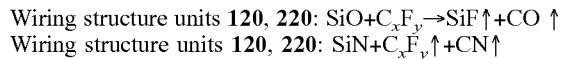

Since a fluorocarbon-based gas such as $CF_4$ is used in the etching, a carbon-based protective film is deposited on the polycrystalline silicon film 401, and the polycrystalline silicon film 401 is prevented from being etched and functions as an etching stopper. While progress of etching of the first opening 501 is being stopped at the polycrystalline silicon film 401, at the second opening 502, etching proceeds until a remaining thickness t2 of the insulating layer on the second electrode 302 becomes equal to a film thickness t1 of the insulating layer between the polycrystalline silicon film 401 and the first electrode 301.

Films other than polycrystalline silicon are conceivable as the etching stopper film 401. However, a polycrystalline silicon film is preferably used as the etching stopper film 401 due to the reasons described below.

First, an insulating film made of SiN or SiC is conceivable as the etching stopper film. However, this insulating film is already being used as a part of the multilayer film in the first wiring structure unit 120 and the second wiring structure unit 220. A same material as the first wiring structure unit 120 and the second wiring structure unit 220 is not suitable as an etching stopper for the present purpose. Next, a metal film made of TiN, Ti, or Al is conceivable as the etching stopper film. However, when a metal film is used as the etching stopper film, using a CF-based etching gas causes a non-volatile metal deposit such as TiF or AlF to be produced from the etching stopper film and creates a risk that the metal deposit may adhere to a side wall of the first opening 501. When the non-volatile metal deposit remains adhered to the side wall of the first opening 501 and the like, a problem such as faulty bonding may occur during wire bonding. The metal deposit inside the opening is not an issue in TSV in which the opening is to be filled with metal. In addition, the fact that an opening for wire bonding has a large opening area and, accordingly, a large amount of deposit is produced is also a problem specific to an opening for wire bonding.

From the above, in the present embodiment, a polycrystalline silicon film is selected as an optimal material of the etching stopper film 401.

(Step B3)

FIG. 6 shows a state after performing step B3. In step B3, dry etching of the first opening 501 is advanced and an opening of the polycrystalline silicon film 401 is created. In doing so, etching of the second opening 502 is not advanced. This dry etching step will be described in detail below.

Since deep etching of Si is performed in step B1, the dry etching apparatus to be used is desirably an etching apparatus capable of performing a Bosch process in order to collectively perform simultaneous etching of openings. An ICP etching apparatus can be exemplified as such a dry etching apparatus.

$SF_6$ is conceivable as the etching gas for the polycrystalline silicon film 401. In this etching step, an additive gas such as $O_2$, $N_2$, He, or Ar may be used when appropriate.

When plasma etching is performed using the apparatus described above and the gas described above, a reaction expressed as follows occurs and etching proceeds as a reaction product is discharged from an etching processing chamber.

Polycrystalline silicon film 401: $Si+SF_6 \rightarrow SiF\uparrow$

Since the etching step has a high (>10) selection ratio between an insulating film and silicon, etching of the second opening 502 is not advanced. The etching of step B3 ends once the etching of the polycrystalline silicon film 401 in the first opening 501 ends and the insulating layer 121 becomes exposed.

(Step B4)

FIG. 7 shows a state after performing step B4. In step B4, dry etching of the first opening 501 and the second opening 502 is advanced until the first electrode 301 and the second electrode 302 are reached. This dry etching step will be described in detail below.

Since deep etching of Si is performed in step B1, the dry etching apparatus to be used is desirably an etching apparatus capable of performing a Bosch process in order to collectively perform simultaneous etching of openings. An ICP etching apparatus can be exemplified as such a dry etching apparatus.

The first wiring structure unit 120 and the second wiring structure unit 220 are assumed to be made of silicon oxide, silicon nitride, or silicon carbide. These multilayer films are desirably collectively etched and a fluorocarbon-based gas such as $CF_4$ is conceivable as an etching gas therefor. In this etching step, an additive gas such as $O_2$, $N_a$, He, or Ar may be used when appropriate.

When plasma etching is performed using the apparatus described above and the gas described above, a reaction expressed as follows occurs and etching proceeds as a reaction product is discharged from an etching processing chamber.

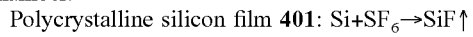
Wiring structure units 120, 220: $SiO+C_xF_y \rightarrow SiF\uparrow+CO\uparrow$
Wiring structure units 120, 220: $SiN+C_xF_y\uparrow+CN\uparrow$ Since an adjustment has been made in step B2 so as to equalize a film thickness of insulating layers that remain on the respective electrodes 301 and 302, etching reaches the first electrode 301 and the second electrode 302 at almost the same time. Accordingly, damage to the electrodes can be minimized.

A portion of the first electrode 301 having been exposed by the first opening 501 becomes the first pad 311 for wire bonding. In addition, a portion of the second electrode 302 having been exposed by the second opening 502 becomes the second pad 312 for wire bonding.

(Step C)

FIG. 8 shows a state after performing step C. In step C, the first wire 601 is bonded onto the first pad 311 being exposed at the bottom of the first opening 501 and, at the same time, the second wire 602 is bonded onto the second pad 312 being exposed at the bottom of the second opening 502. The first wire 601 and the second wire 602 are, for example, wires made of gold or a gold alloy.

According to the configuration of the present embodiment described above, since a power supply structure to the first electrode 301 and the second electrode 302 that exist at different depths is realized by wire bonding, manufacturing cost can be reduced as compared to a structure that utilizes TSV. In addition, since two openings with different depths are formed by simultaneous etching of openings (in other words, etching using a same photoresist), a manufacturing process can be simplified and, at the same time, openings for wire bonding with high reliability can be formed. Furthermore, by adopting a configuration for adjusting depths of openings using an etching stopper constituted by a polycrystalline silicon film, since a metal deposit can be prevented from adhering to side walls of the openings, faulty bonding of wires can be reduced and reliability of power supply by wire bonding can be improved.

In addition, when applying the manufacturing method according to the present embodiment, an annular member made of a non-insulating material that is a residue of the etching stopper film 401 constitutes a part of an inner wall (a side surface) of the first opening 501. Due to a gettering effect of the annular member, a secondary effect of reducing metal contamination from the first opening 501 can also be produced. It should be noted that a member made of the same material as the etching stopper film 401 does not exist on an inner wall (a side surface) of the second opening 502. This is because, in step B2 described earlier, a member that may become an etching stopper is not provided in a region where the second opening 502 is to be formed in order to ensure that only the etching of the second opening 502 is advanced.

Second Embodiment

In the present embodiment, a specific example of a case will be described where the semiconductor apparatus according to embodiments of the present disclosure is applied to a photoelectric conversion apparatus.

Figure 9A:
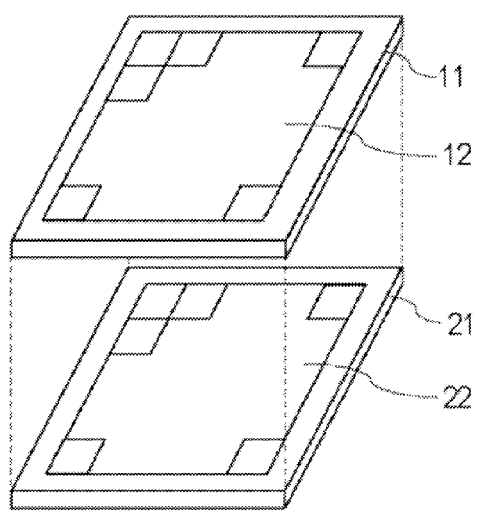
FIGS. 9A to 9C are schematic views of a photoelectric conversion apparatus according to a second embodiment.

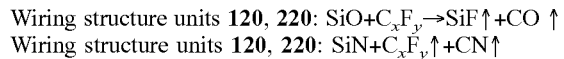
FIG. 9A is a diagram showing a configuration of a stacked photoelectric conversion apparatus. A photoelectric conversion apparatus 1010 is constructed by laminating and electrically connecting two chips, namely, a sensor chip 11 and a circuit chip 21. In this case, the sensor chip 11 corresponds to the first chip 10 in FIG. 1 and the circuit chip 21 corresponds to the second chip 20 in FIG. 1.

A pixel region 12 is arranged on the sensor chip 11 and a circuit region 22 for processing a signal detected by the pixel region 12 is arranged on the circuit chip 21.

Figure 9B:
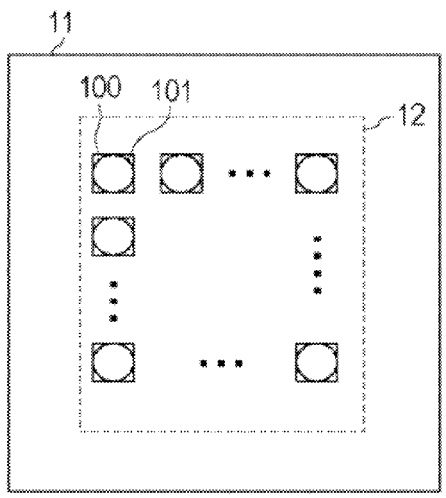

FIG. 9B is an arrangement diagram of the sensor chip 11. Pixels 100 having a photoelectric conversion unit 101 that converts light into an electric signal are arranged in a two-dimensional pattern to form the pixel region 12. While the pixel 100 is typically a pixel for forming an image, when used for time of flight (TOF), an image need not necessarily be formed. In other words, the pixel 100 may be a pixel for measuring a time point of arrival of light and a light amount.

Figure 9C:
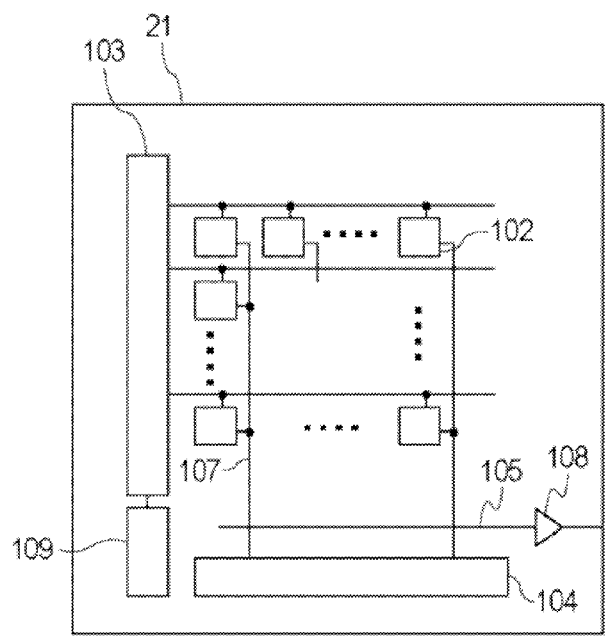

FIG. 9C is a configuration diagram of the circuit chip 21. The circuit chip 21 has a signal processing unit 102 that processes a charge having been photoelectrically converted by the photoelectric conversion unit 101 in FIG. 9B, a control pulse generating unit 109, a horizontal scan circuit unit 104, a signal line 107, and a vertical scan circuit unit 103.

The photoelectric conversion unit 101 shown in FIG. 9B and the signal processing unit 102 shown in FIG. 9C are electrically connected via a connecting wiring provided for each pixel.

The vertical scan circuit unit 103 receives a control pulse supplied from the control pulse generating unit 109 and supplies the control pulse to each pixel. A logic circuit such as a shift register or an address decoder is used in the vertical scan circuit unit 103.

A signal output from the photoelectric conversion unit 101 of each pixel is processed by the signal processing unit 102. The signal processing unit 102 is provided with a counter and a memory and a digital signal is held in the memory.

The horizontal scan circuit unit 104 inputs a control pulse for sequentially selecting each row to the signal processing unit 102 in order to read a signal from the memory of each pixel that holds a digital signal.

For each selected row, a signal is output to the signal line 107 and a signal line 105 from the signal processing unit 102 of the pixel having been selected by the vertical scan circuit unit 103.

The signal output to the signal line 105 is output to an external recording unit or a signal processing unit of the photoelectric conversion apparatus 1010 via an output circuit 108.

In FIG. 9B, the pixels 100 in the pixel region 12 may be arranged one-dimensionally. In addition, the circuit region 22 may be divided into a plurality of regions and the vertical scan circuit unit 103 and the horizontal scan circuit unit 104 may be arranged in each region. A function of the signal processing unit 102 need not necessarily be provided in each and every pixel 100 and, for example, a single signal processing unit 102 may be shared by a plurality of pixels 100 and signal processing may be performed sequentially.

Figure 10:
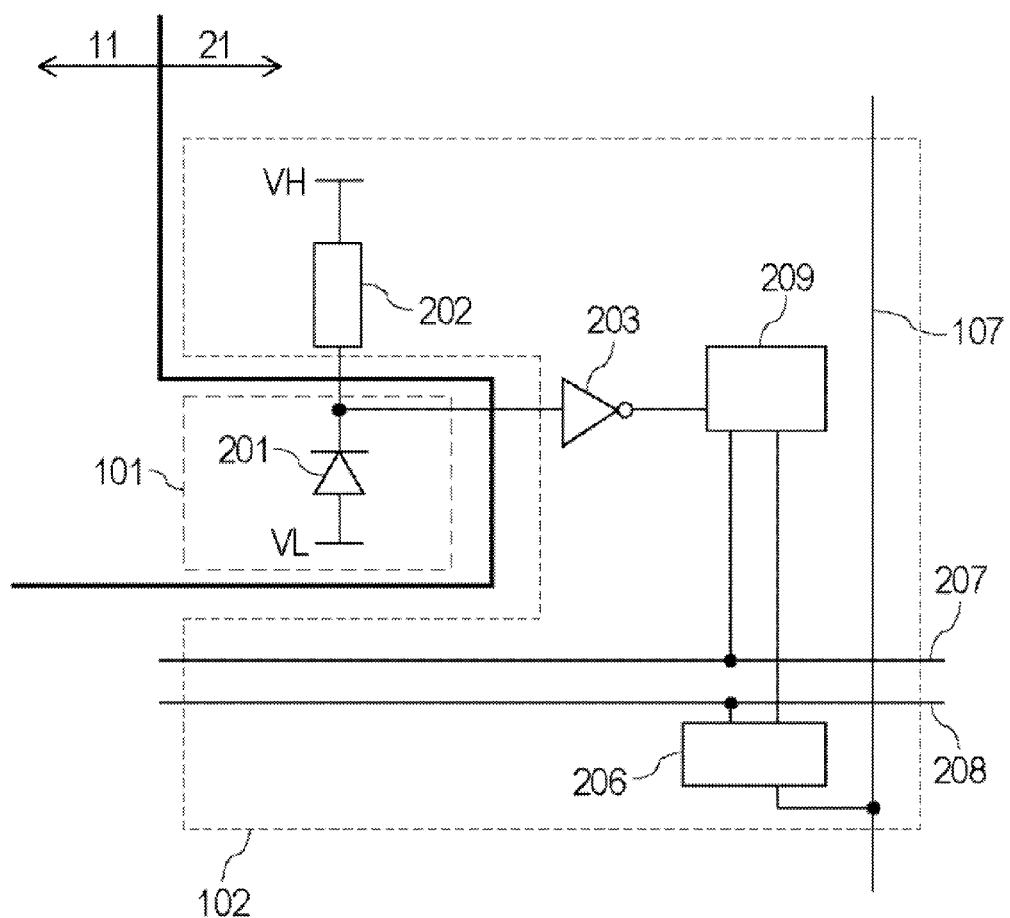
FIG. 10 is a block diagram of a pixel according to the second embodiment.

FIG. 10 is an example of a block diagram including the equivalent circuit shown in FIGS. 9B and 9C. In FIG. 10, the photoelectric conversion unit 101 having a photodiode 201 is provided in the sensor chip 11 and other members are provided in the circuit chip 21.

The photodiode 201 generates a charge pair in accordance with incident light by photoelectric conversion. A voltage VL (first voltage) is supplied to an anode of the photodiode 201. In addition, a voltage VH (second voltage) that is higher than the voltage VL supplied to the anode is supplied to a cathode of the photodiode 201. Although not illustrated, the voltage VH (second voltage) is also supplied to circuits provided on the circuit chip 21. The anode and the cathode of the photodiode 201 are supplied with voltages with a reverse bias that causes the photodiode 201 to act as an avalanche diode. By creating a state where such voltages are supplied, a charge created by the incident light causes avalanche multiplication and an avalanche current is created. When voltages of a reverse bias are supplied and a potential difference between the anode and the cathode is greater than a breakdown voltage, the avalanche diode enters a Geiger mode operation. For example, the voltage VL (first voltage) is −30 V and the voltage VH (second voltage) is 1.1 V.

A quenching element 202 is connected to a power supply that supplies the voltage VH and to the photodiode 201. The quenching element 202 has a function of replacing a change in the avalanche current created in the photodiode 201 with a voltage signal. The quenching element 202 functions as a load circuit (quenching circuit) during signal multiplication due to the avalanche multiplication and is responsible for suppressing the voltages to be supplied to the photodiode 201 to suppress avalanche multiplication (a quenching operation). The photodiode 201 provided in the sensor chip 11 and the quenching element 202 provided in the circuit chip 21 are electrically connected via a connecting wiring provided for each pixel.

The signal processing unit 102 has a waveform shaping unit 203, a counter circuit 209, and a selection circuit 206. In the present specification, the signal processing unit 102 need only have any of the waveform shaping unit 203, the counter circuit 209, and the selection circuit 206. For example, the counter circuit 209 is also the signal processing unit 102.

The waveform shaping unit 203 shapes a potential change of the cathode of the photodiode 201 that is obtained upon photon detection and outputs a pulse signal. For example, an inverter circuit is used as the waveform shaping unit 203. While an example in which a single inverter is used as the waveform shaping unit 203 is shown in FIG. 10, a circuit in which a plurality of inverters are connected in series may be used or another circuit with a waveform shaping effect may be used.

The counter circuit 209 counts pulse signals output from the waveform shaping unit 203. For example, in the case of an N-bit counter (where N is a positive integer), the counter circuit 209 can count pulse signals due to a signal photon up to approximately 2 to the N-th power. The counted signals are held as detected signals. In addition, when a control pulse pRES is supplied via a drive line 207, the signals held in the counter circuit 209 are reset.

The selection circuit 206 is supplied a control pulse pSEL via a drive line 208 shown in FIG. 10 (not illustrated in FIG. 9C) from the vertical scan circuit unit 103 shown in FIG. 9C and switches between electric connection and non-connection of the counter circuit 209 and the signal line 107. For example, the selection circuit 206 includes a buffer circuit for outputting signals and the like.

A switch such as a transistor may be arranged between the quenching element 202 and the photodiode 201, the photoelectric conversion unit 101 and the signal processing unit 102, and the like to switch between electric connection and non-connection. In a similar manner, supply of the voltage VH or the voltage VL to be supplied to the photoelectric conversion unit 101 may be electrically switched using a switch such as a transistor.

In the pixel region 12 in which a plurality of pixels are arranged in a matrix pattern, a captured image may be acquired by a rolling shutter operation in which a count of the counter circuit 209 is sequentially reset for each row and signals held in the counter circuit 209 are sequentially output for each row. Alternatively, a captured image may be acquired by a global electronic shutter operation in which a count of the counter circuit 209 of all pixel rows is simultaneously reset and signals held in the counter circuit 209 are sequentially output for each row. When performing a global electronic shutter operation, means for switching between performing and not performing a count of the counter circuit 209 is preferably provided. An example of the switching means is the switch described above.

A configuration using the counter circuit 209 has been described in the present embodiment. However, a photoelectric conversion apparatus 1010 which acquires a pulse detection timing using a time to digital converter (hereinafter, TDC) and a memory in place of the counter circuit 209 may be adopted. In this case, a generation timing of a pulse signal output from the waveform shaping unit 203 is converted into a digital signal by the TDC. In order to measure a timing of a pulse signal, the TDC is supplied with a control pulse pREF (a referential signal) via a drive line from the vertical scan circuit unit 103 shown in FIG. 9C. Using the control pulse pREF as a reference, the TDC acquires, as a digital signal, a signal when an input timing of a signal output from each pixel via the waveform shaping unit 203 is considered relative time.

Third Embodiment

Figure 11:
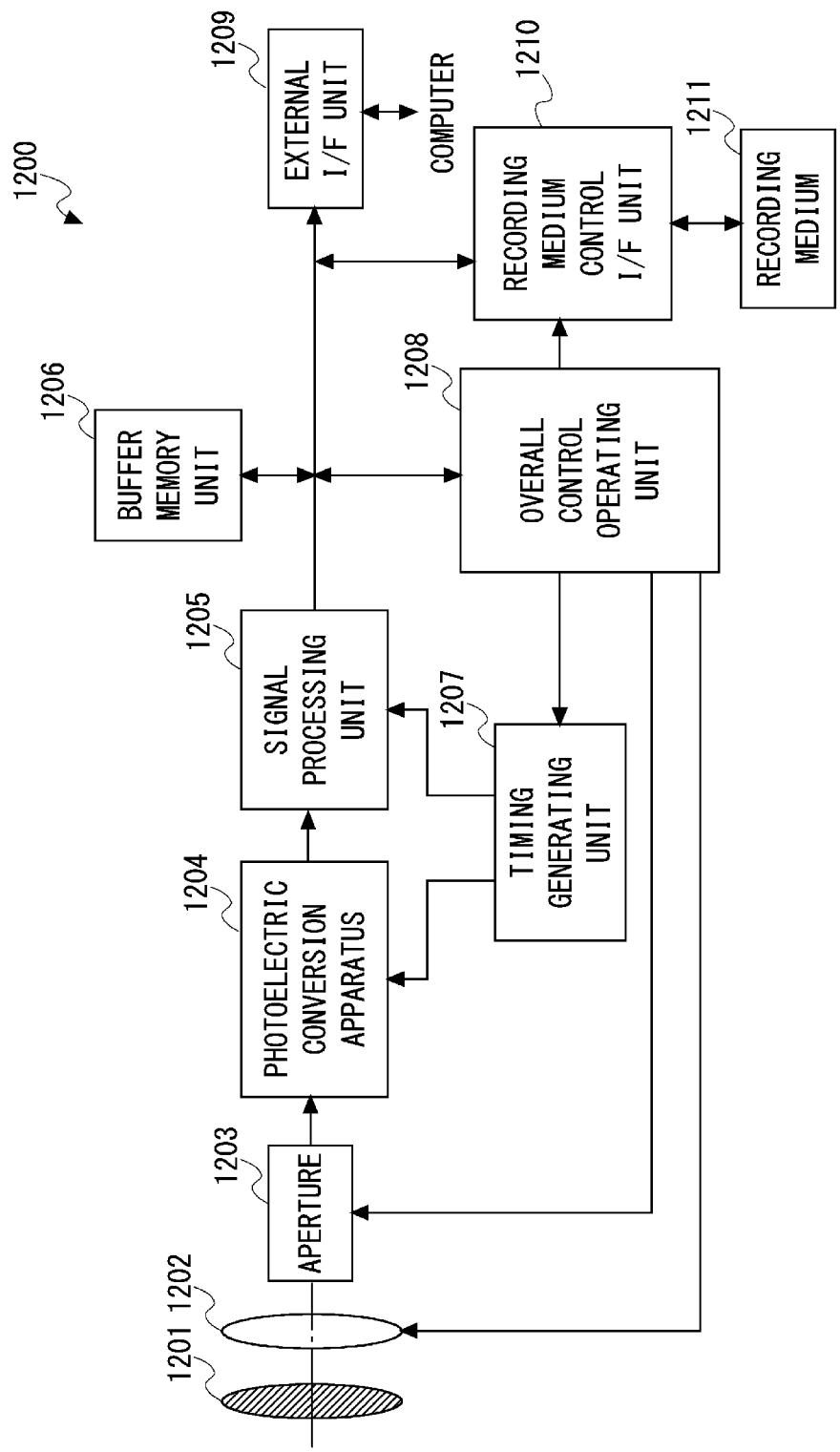
FIG. 11 is a block diagram showing a schematic configuration of a third embodiment.

A device including the semiconductor apparatus according to the first and second embodiments and a peripheral apparatus that is connected to the semiconductor apparatus will be described. A device to which the semiconductor apparatus according to the first and second embodiments can be applied may be an electronic device such as a camera or an information terminal, an office device such as a copier or a scanner, or a medical device such as an endoscope or a CT. In addition, a device to which the semiconductor apparatus according to the first and second embodiments can be applied may be an industrial device such as a robot or a semiconductor manufacturing apparatus, an analyzing device such as an electron microscope, or a transport device such as a vehicle, a vessel, or an airplane. When the semiconductor apparatus is a photoelectric conversion apparatus, a photoelectric conversion system 1200 can be realized by mounting the photoelectric conversion apparatus to these devices. FIG. 11 is a region diagram showing a configuration of the photoelectric conversion system 1200 according to the present embodiment. The photoelectric conversion system 1200 according to the present embodiment includes a photoelectric conversion apparatus 1204. Any of the photoelectric conversion apparatuses described in the embodiments presented above can be applied to the photoelectric conversion apparatus 1204. For example, the photoelectric conversion system 1200 can be used as an imaging system. Specific examples of the imaging system include a digital still camera, a digital camcorder, and a monitoring camera. In FIG. 11, a digital still camera is shown as an example of the photoelectric conversion system 1200.

The photoelectric conversion system 1200 shown in FIG. 11 has the photoelectric conversion apparatus 1204, a lens 1202 that causes an optical image of a subject to be formed on the photoelectric conversion apparatus 1204, an aperture 1203 for variably adjusting a passing light amount of the lens 1202, and a barrier 1201 for protecting the lens 1202. The lens 1202 and the aperture 1203 are optical systems for collecting light to the photoelectric conversion apparatus 1204.

The photoelectric conversion system 1200 has a signal processing unit 1205 for processing an output signal that is output from the photoelectric conversion apparatus 1204. The signal processing unit 1205 performs operations of signal processing in which an input signal is subjected to various corrections and compression when necessary and the input signal is output. The photoelectric conversion system 1200 further has a buffer memory 1206 for temporarily storing image data and an external interface unit (an external I/F unit) 1209 for communicating with an external computer or the like. Furthermore, the photoelectric conversion system 1200 has a recording medium 1211 such as a semiconductor memory for recording or reading imaging data and a recording medium control interface unit (a recording medium control I/F unit) 1210 for performing recording and reading with respect to the recording medium 1211. The recording medium 1211 may be built into the photoelectric conversion system 1200 or may be attachable to and detachable from the photoelectric conversion system 1200. In addition, communication from the recording medium control I/F unit 1210 to the recording medium 1211 and communication from the external I/F unit 1209 may be performed in a wireless manner.

Furthermore, the photoelectric conversion system 1200 has an overall control operating unit 1208 that performs various arithmetic operations and controls the entire digital still camera and a timing generating unit 1207 that outputs various timing signals to the photoelectric conversion apparatus 1204 and the signal processing unit 1205. In this case, the timing signals and the like may be input from outside and the photoelectric conversion system 1200 need at least have the photoelectric conversion apparatus 1204 and the signal processing unit 1205 that processes an output signal that is output from the photoelectric conversion apparatus 1204.

The overall control operating unit 1208 and the timing generating unit 1207 may be configured so as to implement a part of or all of control functions of the photoelectric conversion apparatus 1204.

The photoelectric conversion apparatus 1204 outputs an image signal to the signal processing unit 1205. The signal processing unit 1205 performs predetermined signal processing on the image signal output from the photoelectric conversion apparatus 1204 and outputs image data. In addition, the signal processing unit 1205 generates an image using the image signal. Furthermore, the signal processing unit 1205 may perform a ranging operation with respect to a signal output from the photoelectric conversion apparatus 1204. The signal processing unit 1205 and the timing generating unit 1207 may be mounted to the photoelectric conversion apparatus. In other words, the signal processing unit 1205 and the timing generating unit 1207 may be provided in a chip in which pixels are arranged. By constructing an imaging system using the photoelectric conversion apparatuses according to the respective embodiments described above, an imaging system that enables images with higher quality to be acquired can be realized.

Fourth Embodiment

Figure 12A:
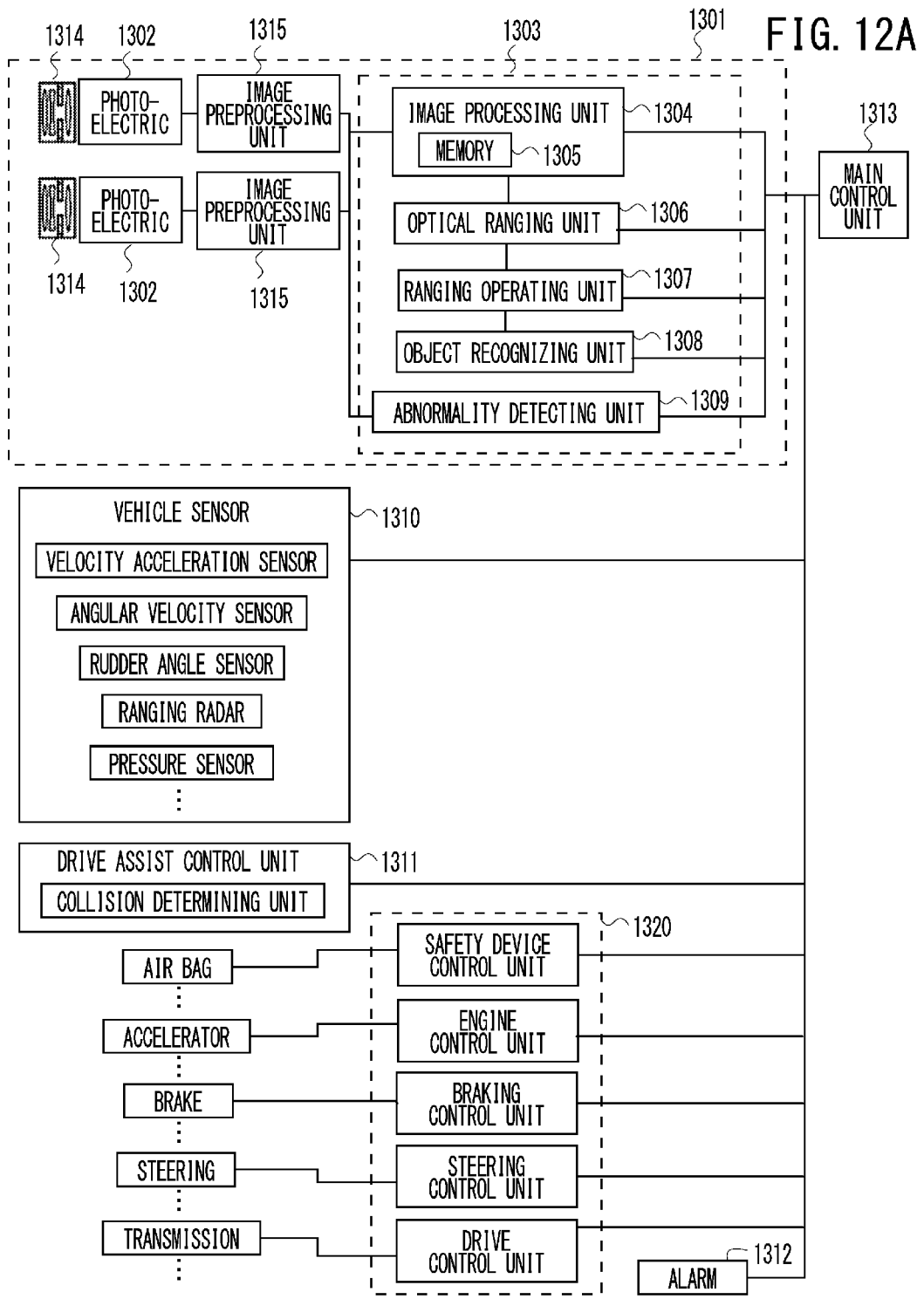
FIG. 12A is a schematic view of a photoelectric conversion system to a fourth embodiment and FIGS. 12B to 12D are schematic views of a moving body according to the fourth embodiment.
Figure 12B:
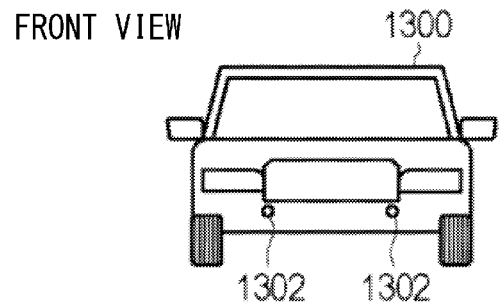
Figure 12C:
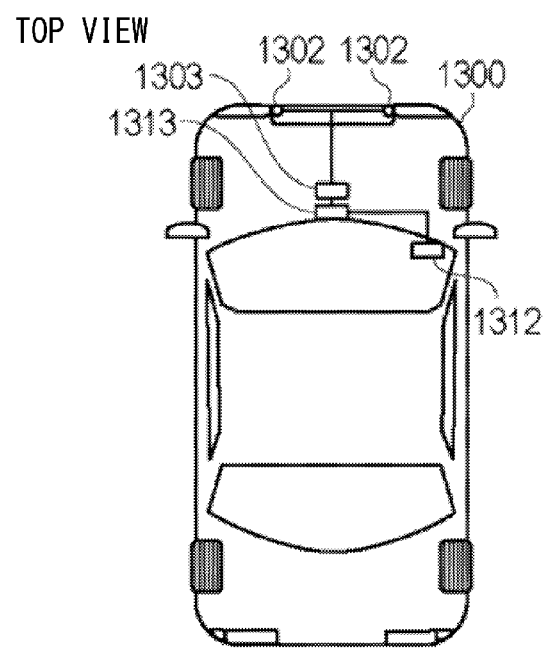
Figure 12D:
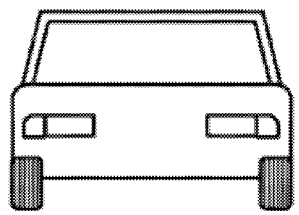
Figure 13:
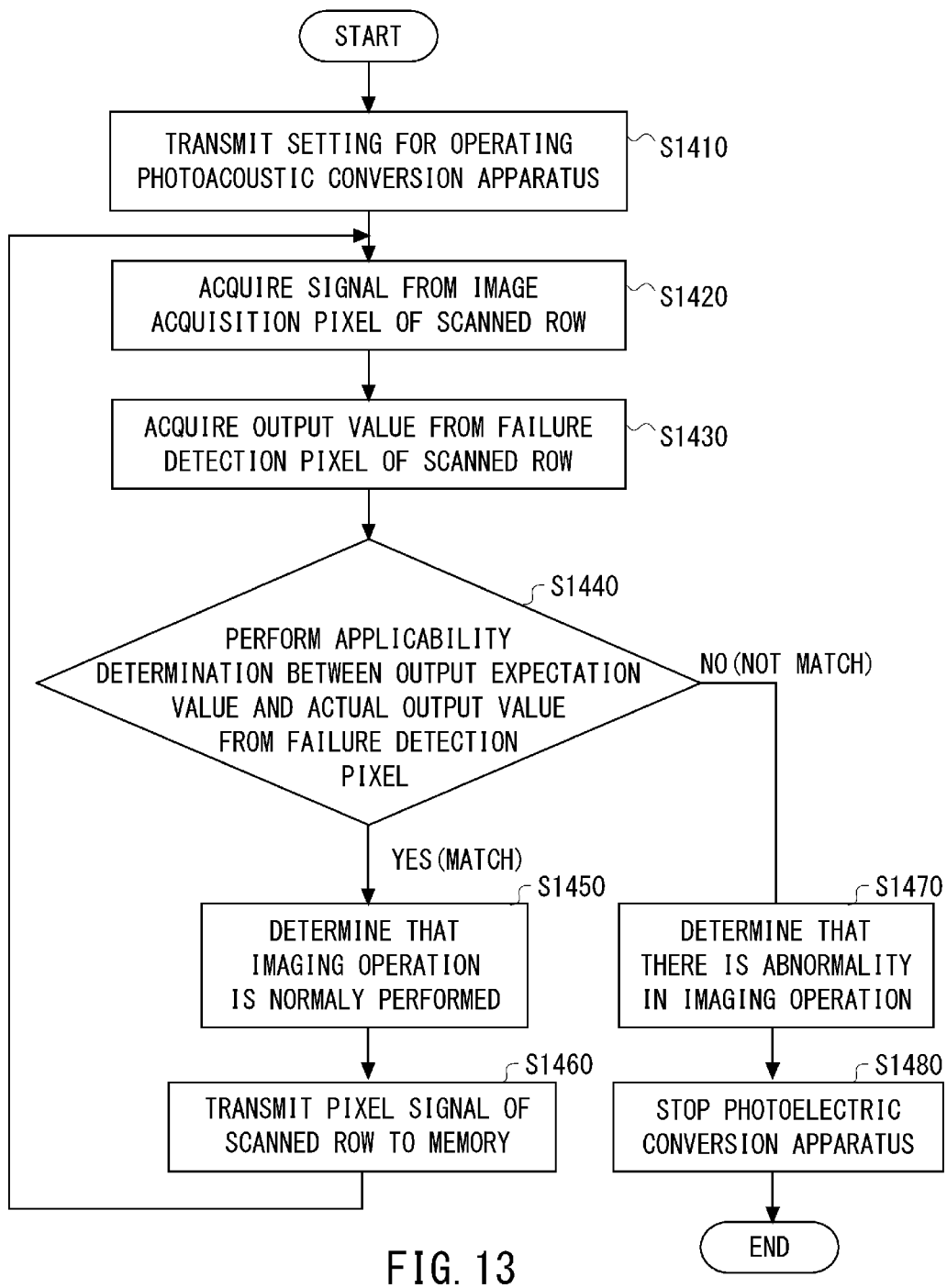
FIG. 13 is a flow chart showing operations of the photoelectric conversion system according to the fourth embodiment.

A photoelectric conversion system and a moving body according to the present embodiment will be described with reference to FIGS. 12A to 12D, and 13. FIG. 12A is a schematic view of a photoelectric conversion system to the present embodiment and FIGS. 12B to 12D are schematic views of a moving body according to the present embodiment. FIG. 13 is a flow chart showing operations of the photoelectric conversion system according to the present embodiment. In the present embodiment, an example of a vehicle-mounted camera will be described as the photoelectric conversion system.

FIG. 12A shows an example of a vehicle system and a photoelectric conversion system which is mounted to the vehicle system and which performs imaging. The photoelectric conversion system 1301 includes a photoelectric conversion apparatus 1302, an image preprocessing unit 1315, an integrated circuit 1303, and an optical system 1314. The optical system 1314 forms an optical image of a subject on the photoelectric conversion apparatus 1302. The photoelectric conversion apparatus 1302 converts the optical image of the subject having been formed by the optical system 1314 into an electric signal. The photoelectric conversion apparatus 1302 is the photoelectric conversion apparatus of any of the embodiments described above. The image preprocessing unit 1315 performs predetermined signal processing on a signal output from the photoelectric conversion apparatus 1302. A function of the image preprocessing unit 1315 may be incorporated into the photoelectric conversion apparatus 1302. The photoelectric conversion system 1301 is provided with at least two sets of the optical system 1314, the photoelectric conversion apparatus 1302, and the image preprocessing unit 1315, and an output from the image preprocessing unit 1315 of each set is to be input to the integrated circuit 1303.

The integrated circuit 1303 is an integrated circuit intended for imaging system applications and includes an image processing unit 1304 including a memory 1305, an optical ranging unit 1306, a ranging operating unit 1307, an object recognizing unit 1308, and an abnormality detecting unit 1309. The image processing unit 1304 performs image processing such as development processing and defect correction with respect to an output signal of the image preprocessing unit 1315. The memory 1305 performs primary storage of captured images and stores detect positions of imaging pixels. The optical ranging unit 1306 performs focusing and ranging of a subject. The ranging operating unit 1307 calculates ranging information from a plurality of pieces of image data acquired by a plurality of photoelectric conversion apparatuses 1302. The object recognizing unit 1308 recognizes a subject such as a vehicle, a road, a sign, or a person. Upon detecting an abnormality of the photoelectric conversion apparatus 1302, the abnormality detecting unit 1309 issues an alarm about the abnormality to a main control unit 1313.

The integrated circuit 1303 may be realized by exclusively-designed hardware, a software module, or a combination thereof. Alternatively, the integrated circuit 1303 may be realized by a field programmable gate array (FPGA), an application specific integrated circuit (ASIC), or the like, or a combination thereof.

The main control unit 1313 integrally controls operations of the photoelectric conversion system 1301, a vehicle sensor 1310, a control unit 1320, and the like. Alternatively, a method may be adopted in which the main control unit 1313 is omitted and the photoelectric conversion system 1301, the vehicle sensor 1310, and the control unit 1320 individually have a communication interface and respectively transmit and receive control signals via a communication network (for example, the CAN standard).

The integrated circuit 1303 has a function of transmitting control signals and setting values to the photoelectric conversion apparatus 1302 either in response to receiving a control signal from the main control unit 1313 or using its own control unit.

The photoelectric conversion system 1301 is connected to the vehicle sensor 1310 and is capable of detecting a travel condition of a host vehicle such as a vehicle speed, a yaw rate, and a steering angle, an external environment of the host vehicle, and conditions of other vehicles and obstacles. The vehicle sensor 1310 is also distance information acquiring means which acquires information related to a distance to an object. In addition, the photoelectric conversion system 1301 is connected to a drive assist control unit 1311 that provides various drive assistance functions such as automatic steering, automatic cruising, and collision avoidance. In particular, with respect to a collision determination function, estimation of a collision and determination of presence or absence of a collision with another vehicle or an obstacle are performed based on a detection result of the photoelectric conversion system 1301 or the vehicle sensor 1310. Accordingly, avoidance control when a collision is estimated and activation of a safety device upon a collision are performed.

Furthermore, the photoelectric conversion system 1301 is also connected to an alarm 1312 which issues a warning to a driver based on a determination result of a collision determining unit. For example, when it is found that the possibility of a collision is high as a determination result of the collision determining unit, the main control unit 1313 performs vehicle control involving applying the brakes, releasing the gas pedal, suppressing engine output, or the like to avoid a collision and/or reduce damage. The alarm 1312 issues a warning to a user by sounding an alarm or the like, displaying warning information on a screen of a display unit of a car navigation system, a meter panel, or the like, vibrating a seat belt or a steering wheel, or the like.

In the present embodiment, an image of a periphery of the vehicle such as the front or the rear of the vehicle is photographed by the photoelectric conversion system 1301. FIGS. 12B to 12D show an example of an arrangement of the photoelectric conversion system 1301 when the front of the vehicle is imaged by the photoelectric conversion system 1301.

Two photoelectric conversion apparatuses 1302 are arranged in the front of a vehicle 1300. Specifically, when a center line with respect to an advancing/retreating direction or an external shape (for example, a vehicle width) of the vehicle 1300 is likened to a symmetrical axis, arranging the two photoelectric conversion apparatuses 1302 so as to be symmetrical about the symmetrical axis is preferable in terms of acquiring information on a distance between the vehicle 1300 and a photographed object and determining collision possibility. In addition, the photoelectric conversion apparatuses 1302 are preferably arranged so as not to impede a field of view of a driver when the driver views a state of the outside of the vehicle 1300 from the driver's seat. The alarm 1312 is preferably arranged so as to readily enter the driver's field of view.

Next, a failure detection operation by the photoelectric conversion apparatus 1302 in the photoelectric conversion system 1301 will be described with reference to FIG. 13. The failure detection operation by the photoelectric conversion apparatus 1302 is carried out in accordance with steps S1410 to S1480 shown in FIG. 13.

Step S1410 is a step of configuring settings upon start-up of the photoelectric conversion apparatus 1302. Specifically, settings for operating the photoelectric conversion apparatus 1302 are transmitted from outside of the photoelectric conversion system 1301 (for example, the main control unit 1313) or inside the photoelectric conversion system 1301 to start an imaging operation and the failure detection operation by the photoelectric conversion apparatus 1302.

Next, in step S1420, a pixel signal is acquired from a valid pixel. In addition, in step S1430, an output value from a failure detection pixel having been provided for failure detection is acquired. The failure detection pixel includes a photoelectric conversion unit in a similar manner to the valid pixel. A predetermined voltage is written into the photoelectric conversion unit. The failure detection pixel outputs a signal corresponding to the voltage having been written into the photoelectric conversion unit. It should be noted that an order of steps S1420 and S1430 may be reversed.

Next, in step S1440, an applicability determination between an output expectation value of the failure detection pixel and an actual output value from the failure detection pixel is performed. As a result of the applicability determination in step S1440, when the output expectation value and the actual output value match, a transition is made to step S1450 to determine that an imaging operation is being performed normally and processing advances to step S1460. In step S1460, a pixel signal of a scanned row is transmitted to and temporarily saved in the memory 1305. Subsequently, a return is made to step S1420 to continue the failure detection operation. On the other hand, as a result of the applicability determination in step S1440, when the output expectation value and the actual output value do not match, the processing makes a transition to step S1470. In step S1470, a determination that there is an abnormality in the imaging operation is made and a warning is issued to the main control unit 1313 or the alarm 1312. The alarm 1312 causes the display unit to display the fact that an abnormality has been detected. Subsequently, in step S1480, the photoelectric conversion apparatus 1302 is stopped and operations of the photoelectric conversion system 1301 are ended.

While an example in which the flow chart is looped for each row has been described in the present embodiment, the flow chart may be looped every plurality of rows or the failure detection operation may be performed for each frame. The warning issued in step S1470 may be notified to the outside the vehicle via a wireless network.

While an example of controlling a vehicle so as to prevent a collision with another vehicle has been described in the present embodiment, the photoelectric conversion system 1301 can also be applied to controlling automated driving so that the vehicle follows another vehicle, controlling automated driving so that the vehicle stays within a lane, and the like. Furthermore, the photoelectric conversion system 1301 is not limited to a vehicle such as an automobile and can also be applied to a moving body (a moving apparatus) such as a ship, an airplane, or an industrial robot. Furthermore, besides moving bodies, the photoelectric conversion apparatus can be applied to a wide variety of devices that utilize object recognition such as an intelligent transportation system (ITS).

Other Embodiments

The present disclosure is not limited to the embodiments described above and various modifications can be made thereof. For example, an example in which a part of components of any of the embodiments is added to another embodiment and an example in which a part of components of any of the embodiments is replaced with a part of components of another embodiment are also embodiments of the present disclosure. It should be noted that disclosed contents of the present specification include not only matters described in the present specification but also all matters that may be comprehended from the present specification and from the drawings accompanying the present specification. In addition, disclosed contents of the present specification include a complementary set of concepts described in the present specification. In other words, supposing that the present specification includes a description reading, for example, "A is B" (A=B), it is assumed that the present specification also discloses or suggests that "A is not B" (A≠B) even though a description of "A is not B" has been omitted. This is because, the presence of a description to the effect that "A is B" is premised on the fact that a case where "A is not B" is being taken into consideration.

It is to be understood that all of the embodiments described above merely represent specific examples when carrying out the present disclosure and that a technical scope of the present disclosure is not be narrowly interpreted in accordance with the embodiments. In other words, the present disclosure can be implemented in various forms without departing from the technical concept or primary features of the present disclosure.

According to the present disclosure, an electric path in a semiconductor apparatus can be improved.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-060351, filed Mar. 30, 2020, which is hereby incorporated by reference herein in its entirety.

What is claimed is:

1. A semiconductor apparatus comprising:
a first semiconductor layer;
a second semiconductor layer stacked to the first semiconductor layer;
a structure provided between the first semiconductor layer and the second semiconductor layer,
a first electrode supported by a first insulating layer and included in the structure;
a second electrode supported by a second insulating layer and included in the structure;
a first wire bonded to the first electrode through a first opening provided in at least the first semiconductor layer;
a second wire bonded to the second electrode through a second opening provided in at least the first semiconductor layer; and
a member made of a material different from the first insulating layer and provided between the first semiconductor layer and the first electrode, the member constituting a side surface of the first opening, wherein
a distance from the second semiconductor layer to a first joint between the first electrode and the first wire is longer than a distance from the second semiconductor layer to a second joint between the second electrode and the second wire, and
another member provided between the first semiconductor layer and the second semiconductor layer and made of a same material as that of the member does not constitute a side surface of the second opening.

2. The semiconductor apparatus according to claim 1, wherein
a width of the first opening is larger than a depth of the first opening, and
a width of the second opening is larger than a depth of the second opening.

3. The semiconductor apparatus according to claim 1, wherein
the first electrode and the second electrode contain aluminum, and
the first wire and the second wire contain gold.

4. The semiconductor apparatus according to claim 1, wherein the material of the member is polycrystalline silicon.

5. The semiconductor apparatus according to claim 1, wherein
voltage to be supplied to the first semiconductor layer is applied to the first electrode, and
voltage to be supplied to the second semiconductor layer is applied to the second electrode.

6. The semiconductor apparatus according to claim 5, wherein
the semiconductor apparatus has a structure in which a first component having the first semiconductor layer and a first wiring structure unit and a second component having the second semiconductor layer and a second wiring structure unit are superimposed on each other so that the first wiring structure unit and the second wiring structure unit face each other, and
the structure is formed by the first wiring structure unit and the second wiring structure unit.

7. The semiconductor apparatus according to claim 6, wherein
the first electrode is provided in the first component, and
the second electrode is provided in the second component.

8. The semiconductor apparatus according to claim 5, wherein the voltage to be applied to the first electrode and the voltage to be applied to the second electrode differ from each other.

9. The semiconductor apparatus according to claim 1, wherein a photodiode is formed in the first semiconductor layer.

10. The semiconductor apparatus according to claim 9, wherein the photodiode is an avalanche diode.

11. A device comprising:
the semiconductor apparatus according to claim 1; and
a peripheral apparatus connected to the semiconductor apparatus.

12. The device according to claim 11, wherein ranging and imaging are performed based on a signal output from the semiconductor apparatus.

13. The device according to claim 11, further comprising control means for controlling a machine on the basis of information obtained from the semiconductor apparatus.

14. The semiconductor apparatus according to claim 1, wherein the material of the member is a non-insulating material.

15. The semiconductor apparatus according to claim 1, wherein the member is annular surrounding the first opening.

16. A manufacturing method for a semiconductor apparatus, the method comprising the steps of:
forming a stacked body with a structure, the structure including a first electrode and a second electrode are formed at different depths, and is interposed between a first semiconductor layer and a second semiconductor layer; and
forming, by etching, a first opening reaching the first electrode from a surface of the first semiconductor layer and exposing the first electrode as a pad for wire bonding, and a second opening reaching the second electrode from the surface of the first semiconductor layer and exposing the second electrode as a pad for wire bonding, wherein
the step of forming a stacked body includes a step of forming an etching stopper film between the first semiconductor layer and the first electrode,
the etching stopper film constitutes a side surface of the first opening and another member made of a material different from that of the etching stopper film constitutes a side surface of the second opening at a same depth, and
in the step of forming, by etching, the first opening and the second opening, a depth of the first opening is made shallower than a depth of the second opening.

17. The manufacturing method for a semiconductor apparatus according to claim 16, wherein the first opening is formed with a shape having a width larger than the depth thereof, and
the second opening is formed with a shape having a width larger than the depth thereof.

18. The manufacturing method for a semiconductor apparatus according to claim 17, wherein in the step of forming, by etching, the first opening and the second opening, a fluorocarbon-based gas is used as an etching gas of the structure.

19. The manufacturing method for a semiconductor apparatus according to claim 16, wherein the material of the etching stopper film is polycrystalline silicon.

20. A semiconductor apparatus comprising:
a first semiconductor layer;
a second semiconductor layer stacked to the first semiconductor layer;
a structure provided between the first semiconductor layer and the second semiconductor layer,
a first electrode supported by a first insulating layer and included in the structure;
a second electrode supported by a second insulating layer and included in the structure;
a first wire bonded to the first electrode through a first opening provided in at least the first semiconductor layer;
a second wire bonded to the second electrode through a second opening provided in at least the first semiconductor layer; and
a member made of a material different from the first insulating layer and provided between the first semiconductor layer and the first electrode, the member constituting a side surface of the first opening, wherein
a distance from the second semiconductor layer to a first joint between the first electrode and the first wire is longer than a distance from the second semiconductor layer to a second joint between the second electrode and the second wire, and
at a same depth of the first opening of the member, another member made of a material different from that of the member constitutes a side surface of the second opening.

21. The semiconductor apparatus according to claim 20, wherein
a width of the first opening is larger than a depth of the first opening, and
a width of the second opening is larger than a depth of the second opening.

22. The semiconductor apparatus according to claim 20, wherein the material of the member is polycrystalline silicon.

23. The semiconductor apparatus according to claim 20, wherein
voltage to be supplied to the first semiconductor layer is applied to the first electrode, and
voltage to be supplied to the second semiconductor layer is applied to the second electrode.

24. The semiconductor apparatus according to claim 23, wherein
the semiconductor apparatus has a structure in which a first component having the first semiconductor layer and a first wiring structure unit and a second component having the second semiconductor layer and a second wiring structure unit are superimposed on each other so that the first wiring structure unit and the second wiring structure unit face each other, and
the structure is formed by the first wiring structure unit and the second wiring structure unit.

25. A device comprising:
   the semiconductor apparatus according to claim 20; and
   a peripheral apparatus connected to the semiconductor apparatus.

26. The device according to claim 25, wherein ranging and imaging are performed based on a signal output from the semiconductor apparatus.

27. The device according to claim 25, further comprising control means for controlling a machine on the basis of information obtained from the semiconductor apparatus.

* * * * *